(12) United States Patent
Huang et al.

(10) Patent No.: US 8,841,723 B2
(45) Date of Patent: Sep. 23, 2014

(54) LDMOS DEVICE HAVING INCREASED PUNCH-THROUGH VOLTAGE AND METHOD FOR MAKING SAME

(75) Inventors: Tsung-Yi Huang, Hsinchu (TW); Huan-Ping Chu, Hsinchu (TW); Ching-Yao Yang, Zhubei (TW); Hung-Der Su, Zhudong Township, Hsinchu County (TW)

(73) Assignee: Richtek Technology Corporation, R.O.C., Hsinchu (TW)

( * ) Notice: Subject to any disclaimer, the term of this patent is extended or adjusted under 35 U.S.C. 154(b) by 544 days.

(21) Appl. No.: 12/720,834

(22) Filed: Mar. 10, 2010

(65) Prior Publication Data

US 2011/0220997 A1 Sep. 15, 2011

(51) Int. Cl.
*H01L 29/66* (2006.01)
*H01L 29/08* (2006.01)
*H01L 29/78* (2006.01)

(52) U.S. Cl.
CPC ...... *H01L 29/7816* (2013.01); *H01L 29/66681* (2013.01); *H01L 29/0878* (2013.01)
USPC ................... 257/339; 257/337; 257/E29.261; 257/E21.616; 438/236

(58) Field of Classification Search
CPC ..................... H01L 29/0878; H01L 29/66681; H01L 29/7816

USPC .......... 257/337, 339, 343, E29.261, E21.616; 438/236
See application file for complete search history.

(56) References Cited

U.S. PATENT DOCUMENTS

| | | | | |
|---|---|---|---|---|
| 5,943,595 | A * | 8/1999 | Akiyama et al. | 438/527 |
| 6,406,974 | B1 * | 6/2002 | Wu et al. | 438/420 |
| 6,828,631 | B2 * | 12/2004 | Rumennik et al. | 257/342 |
| 2005/0227448 | A1 * | 10/2005 | Chen et al. | 438/307 |
| 2011/0057263 | A1 * | 3/2011 | Tang et al. | 257/339 |
| 2011/0269286 | A1 * | 11/2011 | Zuniga et al. | 438/305 |
| 2013/0175616 | A1 * | 7/2013 | Min et al. | 257/339 |

FOREIGN PATENT DOCUMENTS

WO   WO 2009/086517   7/2009

\* cited by examiner

*Primary Examiner* — Colleen A Matthews
*Assistant Examiner* — Colleen E Snow
(74) *Attorney, Agent, or Firm* — Tung & Associates

(57) ABSTRACT

The present invention discloses an LDMOS device having an increased punch-through voltage and a method for making same. The LDMOS device includes: a substrate; a well of a first conductive type formed in the substrate; an isolation region formed in the substrate; a body region of a second conductive type in the well; a source in the body region; a drain in the well; a gate structure on the substrate; and a first conductive type dopant region beneath the body region, for increasing a punch-through voltage.

2 Claims, 4 Drawing Sheets

LDMOS DEVICE HAVING INCREASED PUNCH-THROUGH VOLTAGE AND METHOD FOR MAKING SAME

BACKGROUND OF THE INVENTION

1. Field of Invention

The present invention relates to a lateral diffused metal-oxide-semiconductor (LDMOS) device having an increased punch-through voltage; particularly, it relates to an LDMOS device having an increased punch-through voltage without sacrificing its breakdown voltage. The present invention also relates to a method for making such an LDMOS device.

2. Description of Related Art

An LDMOS device is often used in applications requiring high voltage devices, such as high power and high frequency band power amplifiers. The LDMOS device has a characteristic that it can sustain high voltages from tens to hundreds of volts.

In terms of structure, an LDMOS device is similar to a typical field effect transistor (FET). Both the LDMOS and the FET devices comprise a source and a drain formed in a substrate and separated by a drift region, and a gate structure formed on the drift region. However, the LDMOS device is different from the typical FET device in that, in the typical FET device, the source and drain are symmetric with respect to the gate structure, but in the LDMOS device, the drain is farther from the gate structure as compared to the source.

FIG. 1 shows a prior art LDMMOS device structure, which comprises: a substrate 11, a well 12, an isolation region 13, a body region 14, a source 15, a drain 16, a gate structure 17, and a body contact 19. The substrate 11 is doped with impurities having a conductive type opposite to that of the source 15 and drain 16. A drift region 21 shown by slash lines is formed between the source 15 and drain 16. A PN junction is formed between the substrate 11 and the well 12, and when the PN junction is reversely biased, a depletion region is formed around the junction as shown by the dash lines in the figure. Once the reverse bias is higher than the punch-through voltage, the depletion region extends to the body region 14, and a leakage current increases abruptly, inducing a punch-through effect from the body region 14 to the substrate 11 and causing damages to the device or malfunction.

As the technology trend requires even smaller device dimension and even higher voltage applied to a device, the aforementioned prior art has to increase the punch-through voltage accordingly. In the aforementioned prior art, a higher punch-through voltage can be achieved by increasing the ion implantation dosage during formation of the well 12. However, this will also decrease the breakdown voltage of the device, limiting the applications of the device.

In view of the foregoing disadvantage in the prior art, the present invention provides an LDMOS device having an increased punch-through voltage without sacrificing the breakdown voltage; the present invention also provides a method for making such device.

SUMMARY OF THE INVENTION

The first objective of the present invention is to provide an LDMOS device having an increased punch-through voltage.

The second objective of the present invention is to provide a method for making an LDMOS device having an increased punch-through voltage.

To achieve the objectives mentioned above, from one perspective, the present invention provides an LDMOS device having an increased punch-through voltage, comprising: a substrate; a well of a first conductive type formed in the substrate; an isolation region formed in the substrate; a body region of a second conductive type in the well; a source in the body region; a drain in the well; a gate structure on the substrate; and a first conductive type dopant region beneath the body region, for increasing a punch-through voltage.

In the aforementioned LDMOS device, the first conductive type dopant region preferably has a cross-section width substantially the same as the cross-section width of the body region, such that the first conductive type dopant region can be formed by a mask pattern the same as a mask pattern for forming the body region.

In one embodiment of the aforementioned LDMOS device, the first conductive type dopant region is formed by implanting a first conductive type impurities beneath the body region with a mask pattern the same as a mask pattern for forming the body region, and the implantation for example is performed according to parameters of: an acceleration energy from 200,000 electron volts to 2,000,000 electron volts; an implantation species containing phosphorous or arsenic ions; and an implantation dosage from 1E12 to 1E14 ions per centimeter square.

In another embodiment, the first conductive type dopant region is a buried layer. In this embodiment, the implantation for example is performed according to parameters of: an acceleration energy from 40,000 electron volts to 400,000 electron volts; an implantation species containing phosphorous, arsenic, or antimony ions; and an implantation dosage from 1E12 to 3E15 ions per centimeter square.

In the aforementioned LDMOS device, the isolation region may be formed by local oxidation of silicon (LOCOS) or shallow trench isolation (STI).

In the aforementioned LDMOS device, the substrate may be a semiconductor substrate with or without an epitaxial layer.

From another perspective, the present invention provides a method for making an LDMOS device having an increased punch-through voltage, comprising: providing a substrate; forming a well of a first conductive type in the substrate; forming an isolation region in the substrate; forming a body region of a second conductive type in the well; forming a source in the body region; forming a drain in the well; forming a gate structure on the substrate; and forming a first conductive type dopant region beneath the body region, for increasing a punch-through voltage.

The aforementioned method for making an LDMOS device may further comprise: forming a body contact in the body region as an electrical contact terminal of the body region.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, but not drawn according to actual scale.

Figure 1:
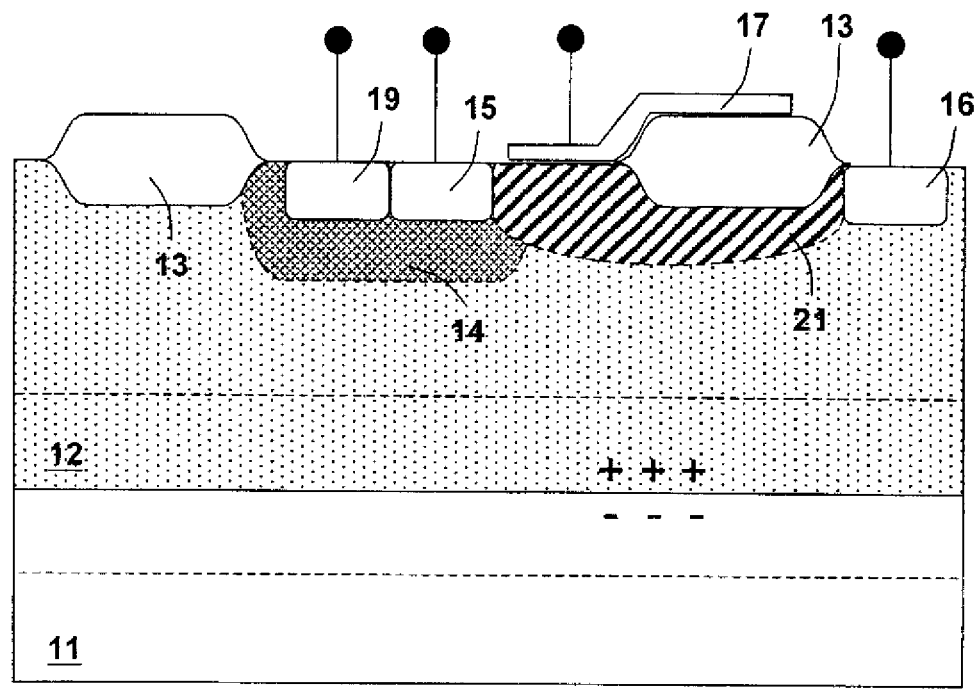
FIG. 1 is a cross-section view illustrating a prior art LDMOS device.
Figure 2:
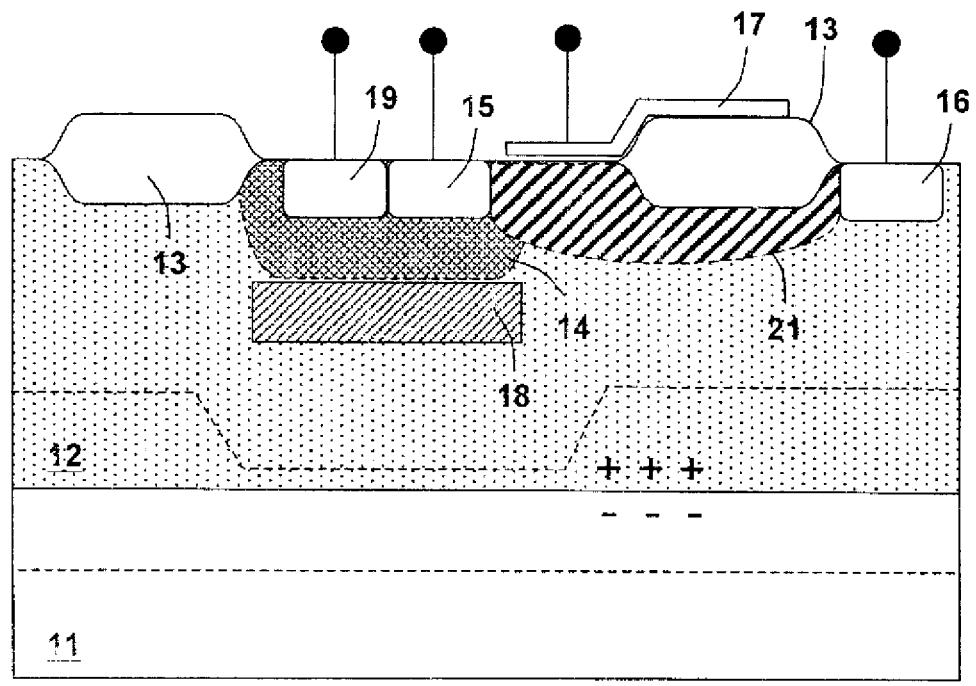
FIG. 2 illustrates a first embodiment of the present invention by cross-section view.

FIG. 2 shows a first embodiment of the present invention which illustrates a structure of an LDMOS device. As shown in FIG. 2, the LDMOS device comprises: a substrate 11; a first conductive type well 12, an isolation region 13 (which can be LOCOS or STI, shown as LOCOS for example in this and the following embodiments), a second conductive type body region 19, and a drain 16 formed in a substrate 11; a gate structure 17 formed on the substrate 11; and a source 15 and a body contact 19 formed in the body region 14. The first conductive type is N-type for example, and so are the embodiments below, but it certainly can be P-type. In addition to the above, in this embodiment, a first conductive type dopant region 18 is formed by implanting a first conductive type dopant beneath the body region 14. The first conductive type dopant region 18 preferably has a cross-section width (or a planar pattern) substantially the same as the cross-section width (or the planar pattern) of the body region 14, such that the first conductive type dopant region 18 can be formed by a mask pattern the same as a mask pattern for forming the body region 14. However, different mask patterns and different implantation regions can certainly be used for forming the first conductive type dopant region 18. An ion implantation process is used to implant impurities beneath the body region, and the implantation is preferably performed according to parameters of: an acceleration energy from 200,000 electron volts to 2,000,000 electron volts; an implantation species containing phosphorous or arsenic ions; and an implantation dosage from 1E12 to 1E14 ions per centimeter square.

Referring to FIG. 2, a PN junction is formed between the well 12 and the substrate 11 (i.e., if the substrate 11 is of a second conductive type), or between the well 12 and a second conductive type deep well formed beneath the well 12. When the operation of the device causes the PN junction to be reversely biased, due to the effect provided by the first conduction type dopant region 18 which increases the first conductive type impurity concentration (thus, more carriers) below the body region 14, the part of the PN junction below the first conductive type dopant region 18 has a relatively narrower depletion region compared to other regions as indicated by the dash line in the figure. In other words, the reverse bias applied to the PN junction below the first conductive type dopant region 18 must be increased to a relatively high level to cause the depletion region to extend to the body region 14, that is, it is more difficult to induce PN junction punch-through, and thus the application of the device becomes wider because the punch-through voltage of the device is increased. On the other hand, because the impurity concentration of the drift region 21 between the source 15 and the drain 16 remains nearly unchanged, the breakdown voltage of the device is not impacted. In brief, the formation of the first conductive type dopant region 18 increases the punch-through voltage of the LDMOS device without sacrificing the breakdown voltage, and furthermore it does not require adding any extra mask, or changing any other process parameter (for example, the thermal budget). This is one advantage of the present invention over the prior art. In this embodiment, the substrate 11 may be a semiconductor substrate with or without an epitaxial layer.

Figure 3:
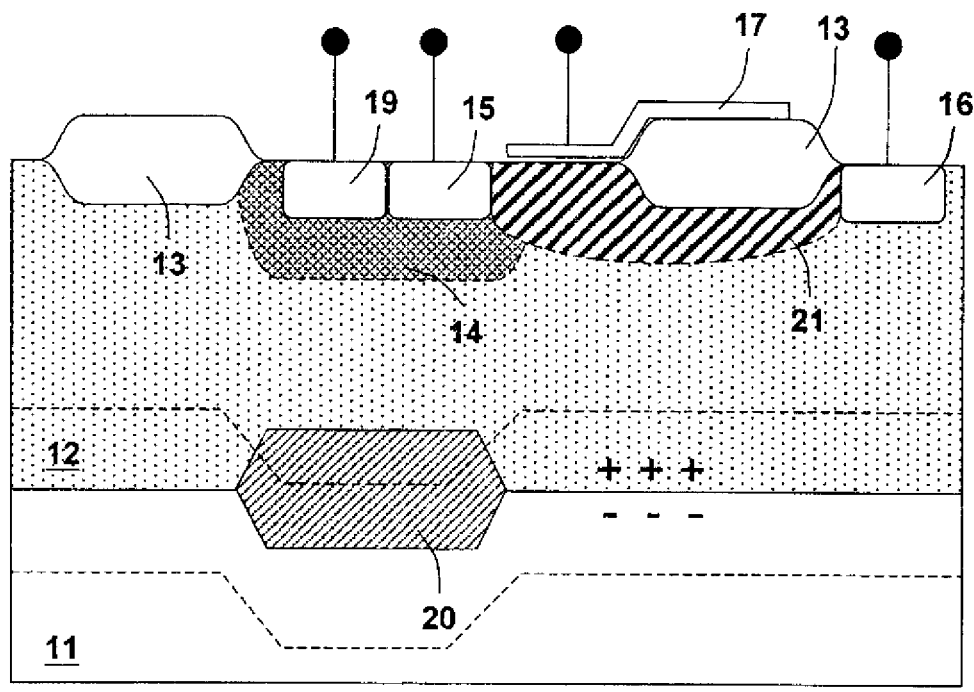
FIG. 3 illustrates a second embodiment of the present invention by cross-section view.

FIG. 3 illustrates a second embodiment of the present invention, which shows another structure of an LDMOS device. As shown in FIG. 3, a first conductive type dopant region 20 is formed, which is a first conductive type buried layer formed by epitaxial growth and implantation. The first conductive type buried layer preferably has a cross-section width (or a planar pattern) substantially the same as the cross-section width (or a planar pattern) of the body region 14, such that the first conductive type dopant region 20 can be formed by a mask pattern the same as a mask pattern for forming the body region 14. However, different mask patterns and different implantation regions can certainly be used for forming the first conductive type dopant region 20. The implantation is preferably performed according to parameters of: an acceleration energy from 40,000 electron volts to 400,000 electron volts; an implantation species containing phosphorous, arsenic, or antimony ions; and an implantation dosage from 1E12 to 3E15 ions per centimeter square.

Next, a first conductive type well 12, an isolation 13, a second conductive body region 14, a drain 16, a gate structure 17 on the surface of the substrate 11, and a source 15 and a body contact 19 in the body region 14 are formed. As shown in FIG. 3, a PN junction is formed between the well 12 and the substrate 11. When the operation of the device causes the PN junction to be reversely biased, due to the effect provided by the first conduction type dopant region 20 which increases the first conductive type impurity concentration (more carriers) below the body region 14 and in the well 12, the part of the PN junction below the body region 14 and in the well 12 has a relatively narrower depletion region compared to other regions as indicated by the upper dash line in the figure; in contrast, the PN junction below the body region 14 and in the substrate 11 has a relatively wider depletion region compared to other regions as indicated by the lower dash line in the figure, because the first conduction type dopant region 20 increases the first conductive type impurity concentration while decreases the second conductive type impurity concentration in the substrate 11. Thus, in comparison with prior art, the reverse bias applied to the PN junction below the first conductive type dopant region 20 must be increased to a relatively high level to cause the depletion region to extend to the body region 14. In other words, due to the first conductive type dopant region 20, the punch-through voltage of the device is increased, and the application of the device becomes wider. On the other hand, because the impurity concentration of the drift region 21 between the source 15 and the drain 16 remains nearly unchanged, the breakdown voltage of the device is not impacted. In brief, the formation of the first conductive type dopant region 20 increases the punch-through voltage of the LDMOS device without sacrificing the breakdown voltage, and furthermore it does not require adding any extra mask, or changing any other process parameter (for example, the thermal budget). This is one advantage of the present invention over the prior art. In this embodiment, the substrate 11 is preferably a semiconductor substrate having an epitaxial layer for better forming the first conductive type buried layer, but the substrate 11 of the present invention is not necessarily required to include an epitxial layer.

Figure 4A:
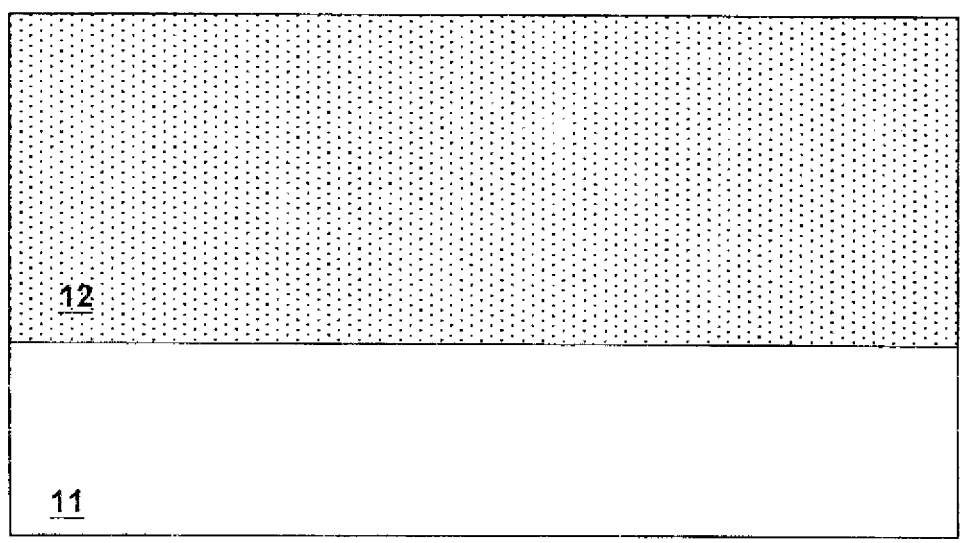
FIGS. 4A-4D are cross-section views illustrating a method embodiment of the present invention.
Figure 4B:
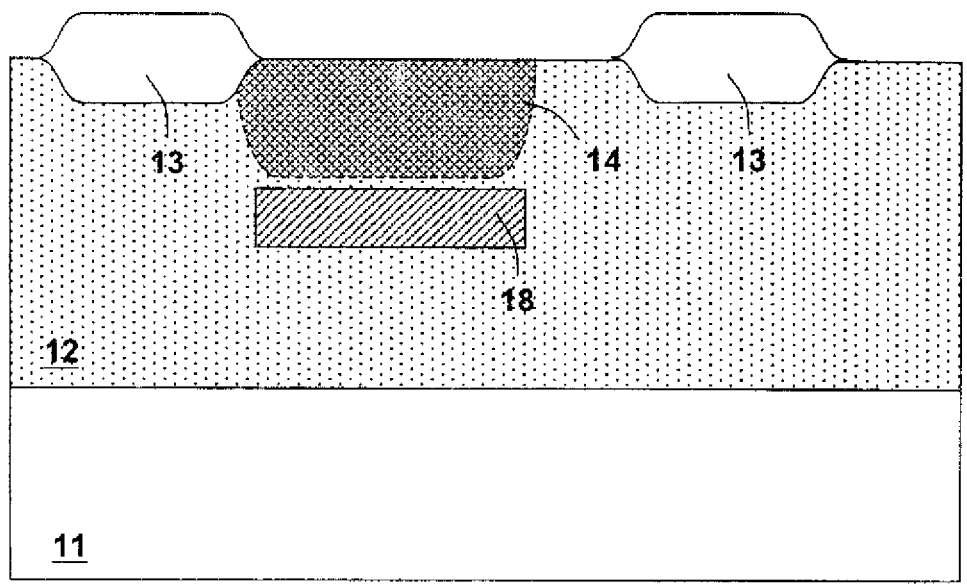
Figure 4C:
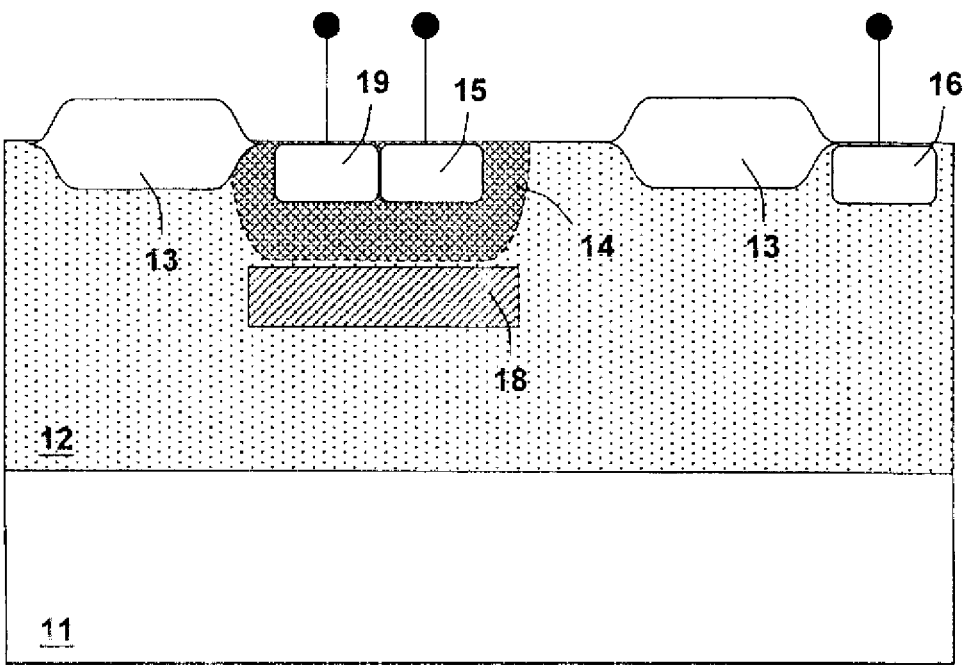

Please refer to the cross-section views of FIGS. 4A-4D, which show a method embodiment of the present invention. First, as shown in FIG. 4A, a substrate 11 is provided; a first conductive type well 12 is formed in the substrate 11 by lithography and implantation. Next, as shown in FIG. 4B, an isolation region 13 is formed in the substrate 11, for example by LOCOS or STI technology. In the next step, a second conductive type body region 14 and a first conductive type dopant region 18 are formed in the well 12 by lithography and implantation, wherein the sequence of forming the body region 14 and the first conductive type dopant region 18 can be in either order. In the next step, as shown in FIG. 4C, a source 15 and a body contact are formed in the body region 14 by lithography and implantation.

Figure 4D:
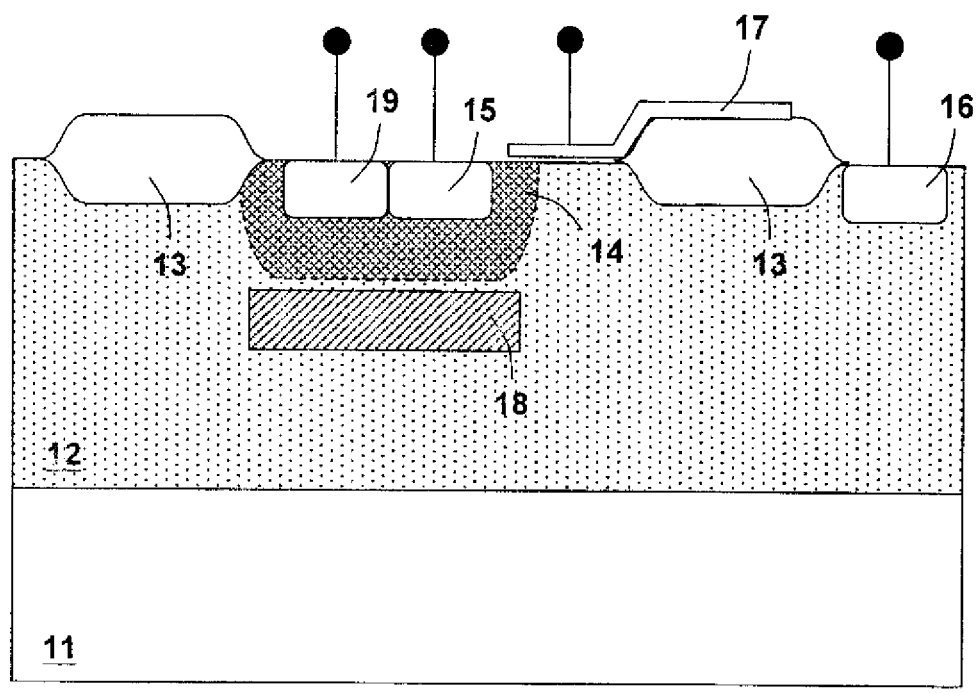

In the next step, as shown in FIG. 4D, a drain 16 is formed in the well 12 by lithography and implantation, and then, a gate structure 17 is formed on the substrate 11.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a deep well, etc., can be added. For another example, the lithography technology is not limited to photolithography technology by a photo mask; it can include electron beam lithography technology. In view of the foregoing, the spirit of the present invention should cover all such and other modifications and variations, which should be interpreted to fall within the scope of the following claims and their equivalents.

What is claimed is:

1. A method for making an LDMOS device having an increased punch-through voltage, comprising:
   providing a substrate;
   forming a well of a first conductive type in the substrate;
   forming an isolation region in the substrate;
   forming a body region of a second conductive type in the well;
   forming a source in the body region;
   forming a drain in the well;
   forming a gate structure on the substrate, wherein the source and the drain are separated by a drift region, and the gate is formed on the drift region; and
   forming a first conductive type dopant region beneath the body region, for increasing a punch-through voltage, by implanting first conductive type impurities beneath the body region, and the implantation is performed according to parameters of:
      an acceleration energy from 40,000 electron volts to 400,000 electron volts;
      an implantation species containing phosphorous, arsenic, or antimony ions; and
      an implantation dosage from 1E12 to 3E15 ions per centimeter square;
   wherein the substrate is a semiconductor substrate of a second conductive type and having an epitaxial layer, and the first conductive type dopant region is a buried layer.

2. A method for making an LDMOS device having an increased punch-through voltage, comprising:
   providing a substrate;
   forming a well of a first conductive type in the substrate;
   forming an isolation region in the substrate;
   forming a body region of a second conductive type in the well;
   forming a source in the body region;
   forming a drain in the well;
   forming a gate structure on the substrate, wherein the source and the drain are separated by a drift region, and the gate is formed on the drift region; and
   forming a first conductive type dopant region beneath the body region, for increasing a punch-through voltage, by implanting first conductive type impurities beneath the body region, and the implantation is performed according to parameters of:
      an acceleration energy from 40,000 electron volts to 400,000 electron volts;
      an implantation species containing phosphorous, arsenic, or antimony ions; and
      an implantation dosage from 1E12 to 3E15 ions per centimeter square;
   wherein the substrate is a semiconductor substrate of a second conductive type and a PN junction is formed between the well and the substrate beneath the well, and when an operation of the LDMOS device causes the PN junction to be reversely biased, a part of the PN junction below the first conductive type dopant region has a relatively narrower depletion region compared to other regions of the PN junction.

* * * * *